(12) United States Patent
Tran et al.

(10) Patent No.: US 6,965,261 B2
(45) Date of Patent: Nov. 15, 2005

(54) ULTRA LOW-POWER DATA RETENTION LATCH

(75) Inventors: Tam Minh Tran, Austin, TX (US); George B. Jamison, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 10/712,198

(22) Filed: Nov. 13, 2003

(65) Prior Publication Data

US 2005/0104643 A1 May 19, 2005

(51) Int. Cl.[7] .............................................. H03K 3/289
(52) U.S. Cl. ...................................... 327/202; 327/203
(58) Field of Search ................................. 327/202–204, 327/544; 365/145, 154, 156, 185.04, 185.25, 365/205, 222

(56) References Cited

U.S. PATENT DOCUMENTS 5,844,422 A * 12/1998 Trimberger et al. ........... 326/38
6,650,158 B2 * 11/2003 Eliason ........................ 327/203

* cited by examiner

Primary Examiner—Kenneth B. Wells

(74) Attorney, Agent, or Firm—Alan K. Stewart; W. James Brady, III; Frederick J. Telecky, Jr.

(57) ABSTRACT

An embodiment of a ultra low-power data retention latch circuit involves a slave latch SL that concurrently latches the same data that is loaded into a main circuit (such as a main latch ML) during normal operation. When the circuit enters a low power (data retention) mode, power (VCC) to the main latch ML is removed and the slave latch SL retains the most recent data (retained data SA, SA-). When power is being restored to the main latch ML, the slave latch's retained data SA, SA- is quickly restored to the main latch ML through what constitute Set and Reset inputs SAR, SAR- of the ML. This arrangement ensures that data restoration is much quicker than conventional arrangements that require the output data path DATA- to be stabilized before power is re-applied to the main latch. Further, there is no need to wait for power to the ML to be stable before restoring data from the SL to the ML, providing an increase in data restoration speed over conventional data retention latches. Using retained data SA, SA- (as mirrored in SAR, SAR-) to control the Set and Reset inputs prevents data contention in the main latch ML. Moreover, compared to known arrangements, the arrangement provides minimal loading on the DATA, DATA- output paths (driving only N7, N8), thus not compromising speed on the data path (DATAIN . . . DATA/DATA-) through the main latch during normal operation.

24 Claims, 2 Drawing Sheets

ULTRA LOW-POWER DATA RETENTION LATCH

BACKGROUND OF THE INVENTION

1. Field of the Invention

The invention generally relates to data retention circuits that retain data during a "low power mode" in which power is removed from certain main circuitry. More particularly, the invention relates to ultra low-power data retention circuits in which it is desired to quickly save data from a main latch to a slave latch, and to quickly replenish the main data latch with retained data, all while minimally loading main data latch data output lines during normal operation.

2. Related Art

In low-power chips, much of the circuitry is shut down when not in use (in a "low power mode") so as to conserve power. However, some parts of the circuit remain powered during low power mode, to retain data. This retained data is used again when the chip emerges from low power mode.

Various back-up data latch arrangements are known in the art. However, in some known arrangements, there is a need to explicitly disable the main latch while awaiting or during stable power restoration. In some conventional arrangements, additional gates or signals are required in order to disable the main data path until power is stably restored. Also, some known latch arrangements require additional isolation or buffer circuitry, or have a circuit topology, that effectively add to the time required to pass data through the latch, undesirably slowing data throughput. For example, in certain conventional retention latches, the back-up latch's lines are connected the data output nodes of the main latch, adding loading to the main data path; undesirably, more time is needed for the main latch to correctly resolve before the main data path can safely be enabled. Also, certain known arrangements require power to the main latch to be kept off until data is restored to the normal output path, slowing the circuit's return to normal operation. Furthermore, some conventional latch arrangements simply consume undesirably large amounts of power.

Accordingly, there is a need in the art for a fast, ultra low-power arrangement that avoids the need to provide explicit disablement of a main latch and that does not require additional gates or signals to achieve disablement of the main data path.

SUMMARY

An arrangement retains data output from a main circuit (ML) throughout a low power mode, and restores the retained data to the main circuit (ML) upon termination of the low power mode. The arrangement includes a slave latch configured to store the data output from the main circuit as the retained data throughout the low power mode and a control portion configured to restore the retained data to the main circuit through Set and Reset inputs to the main circuit (ML), so as to unambiguously determine restored data output (DATA and/or DATA) upon the termination of the low power mode. In one embodiment, the Set and Reset signals directly control at least one main circuit data output without delay other than a logic gate propagation delay. In another embodiment, the Set and Reset signals are stably asserted before power is stably restored to the main latch. In still another embodiment, in a normal mode distinct from the low power mode, the slave latch and main circuit store input data concurrently.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figure 1:
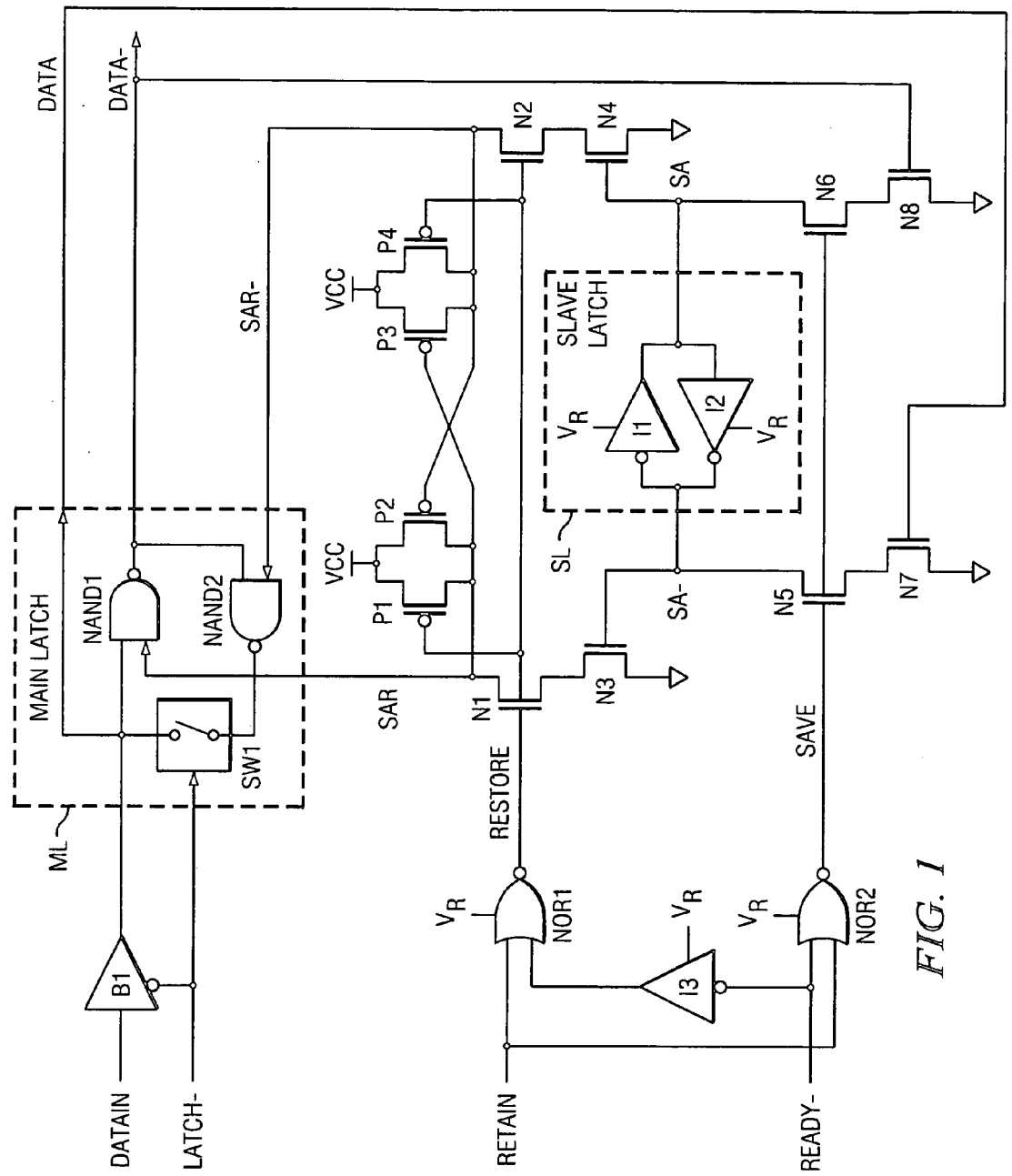
FIG. 1 illustrates an embodiment of an ultra low-power data retention latch arrangement.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used to interpret the claims.

Moreover, features and procedures whose implementations are well known to those skilled in the art are omitted for brevity. For example, design, selection, and implementation of basic electronic circuit elements such as signal level shifters, buffers, logic elements, current and voltage sources, diodes, bipolar transistors, metal oxide semiconductor field effect transistors (MOSFETs), transmission gates, delay elements, and the like, lie within the ability of those skilled in the art, and accordingly any detailed discussion thereof may be omitted.

This specification describes an arrangement including a main circuit such as a "main latch," and elements to for saving the main latch's data into an ultra low-power "slave latch" when new data is latched into the main latch. The data saved in the slave latch (for example, at the beginning of low-power mode) is immediately loaded back to the main latch as soon as power is fully restored. FIG. 1 illustrates one embodiment of such an ultra low-power data retention latch arrangement.

Briefly, a tri-state buffer BI buffers input binary data on line DATAIN to a main latch ML whenever a latch signal LATCH- is active. Main latch ML latches data on node DATA under control of latch signal LATCH- and provides a binary data output DATA- that is an inverted version of DATAIN and DATA.

When a main voltage VCC is no longer provided to the ML, ML's data is lost. However, a slave latch SL, powered by an always-on retention voltage $V_R$, retains the data throughout the loss of VCC and replenishes the data in ML as main voltage VCC is stably restored.

Referring in more detail to FIG. 1, ML may include a first logical NAND gate NAND1 that receives the DATA signal and a signal SAR (described below). NAND1 drives a second logical NAND gate NAND2, which receives a signal SAR- (also described below). A switch SW1 passes NAND2's output back to the data input of NAND1 under control of LATCH- in a manner that prevents conflict between tri-state buffer B1 and switch SW1. SW1 may be implemented as a conventional transmission gate, with the sources and drains of opposite-conductivity metal oxide semiconductor field effect transistors (MOSFETs) being connected together and whose respective gates are connected to opposite-polarity versions of LATCH-. NAND1 and NAND2 may be implemented using conventional MOSFET technology.

Those skilled in the art will readily recognize that ML inputs SAR and SAR-operate as "set" and "reset" inputs. That is, when either SAR or SAR- goes low, its corresponding NAND gate output NAND1 or NAND2 is forced high with no delay other than propagation delay through the logic gates NAND1 or NAND2. NAND1 and NAND2 may have additional inputs (not shown) for use during development and testing.

Slave latch SL may be implemented using two inverters 11 and 12, the output of each being connected to the input of the other. I1 provides saved data output SA and 12 provides inverted saved data output SA-.

Two pairs of p-channel MOSFETs P1, P2 and P3, P4 are provided, whose sources are connected to VCC, the voltage that may be turned off. The drains of P1 and P2 are connected to the gate of P3 (node SAR); Symmetrically, the drains of P3 and P4 are connected to the gate of P2 (node SAR-). The gates of P1 and P4 are driven by a RESTORE signal (described below).

Node SAR may be connected to ground through a series of an n-channel MOSFET N1 whose gate is controlled by the RESTORE signal, and a n-channel MOSFET N3 whose gate is controlled by SA-. Symmetrically, node SAR may be connected to ground through a series of an n-channel MOSFET N2 whose gate is controlled by the RESTORE signal, and a n-channel MOSFET N4 whose gate is controlled by SA.

Inverted saved data output signal SA- may be connected to ground through a series of an n-channel MOSFET N5 whose gate is controlled by the SAVE signal, and a n-channel MOSFET N7 whose gate is controlled by DATA. Symmetrically, saved data output signal SA may be connected to ground through a series of an n-channel MOSFET N6 whose gate is controlled by the SAVE signal, and a n-channel MOSFET N8 whose gate is controlled by DATA-.

Figure 2:
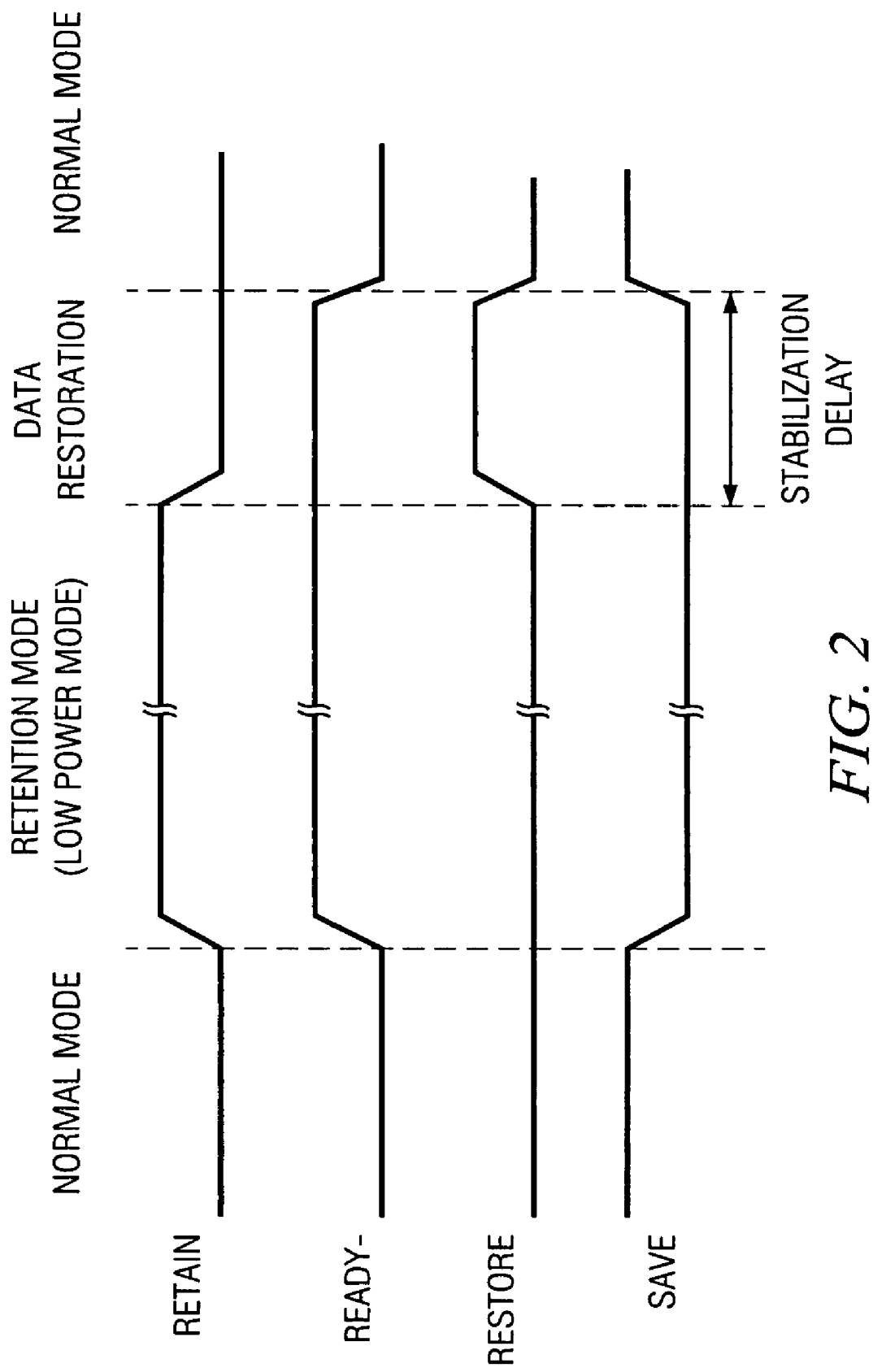
FIG. 2 is a timing diagram illustrating operation of the embodiment of FIG. 1.

Two signals RETAIN and READY- govern operation of the data retention latch throughout its operation, as illustrated in the timing diagram of FIG. 2:

When RETAIN is active (high), the circuit is in low power mode and slave latch SL is isolated from main latch ML, with SL retaining the last data from main latch ML before ML is shut down. When the circuit is again powered up, RETAIN goes inactive (low).

READY- goes high (inactive) immediately after RETAIN becomes active, to indicate that the circuit is not ready because main latch ML has lost power. When the circuit is again powered up and RETAIN goes inactive (low), READY- signal remains inactive (high) for a stabilization delay period until power is deemed to be stably restored. During this stabilization delay period, data is restored from the slave latch SL to the main latch ML.

Logical NOR gates NOR1 and NOR2 provide respective signals RESTORE and SAVE in the following manner, reference again being made to the FIG. 2 timing diagram:

To provide the RESTORE signal, NOR1 receives RETAIN and an inverted version of READY- (inverted by an inverter 13). RESTORE is high only during the stabilization delay period immediately following the retention (low power mode) period. During the stabilization delay period, data is restored from SL to ML.

To provide the SAVE signal, NOR2 receives RETAIN and READY-. SAVE is low throughout the retention (low power mode) period and the stabilization delay period.

NOR1, NOR2, I1, I2 and I3 are powered by an always-on retention voltage $V_R$ so that these elements are powered even when voltage VCC is lost.

To minimize power consumption, low leakage or long channel transistors may be employed, especially in those portions of the circuit powered by $V_R$ such as slave latch SL.

Operation of the FIG. 1 circuit is now described with reference to the timing diagram of FIG. 2.

During normal operation, VCC is provided and LATCH- latches data into ML so that DATA and DATA- are provided. RETAIN and READY- are low. Accordingly, SAVE is high, turning on N5 and N6, thus allowing the DATA and DATA- to be stored at respective nodes SA and SA- through N7 and N8, respectively. RESTORE is low, turning on N1 and N2 and allowing whichever one of SA and SA- to govern the state of either SAR or SAR-, respectively.

During retention (low power) mode, it is assumed that voltage VCC is not being provided and main latch ML cannot properly provide DATA or DATA-. RETAIN and READY- signals are high. Accordingly, RESTORE remains low. However, SAVE transitions from high to low, turning off N5 and N6 and ensuring that the last DATA and DATA- before power shutdown (VCC going to zero) are retained at SL's nodes SA and SA-, respectively. An inactive SAVE signal thus isolates SL from ML when ML's outputs are not reliable.

During the data restore (stabilization delay) period, RETAIN transitions to low and but READY- remains high during a stabilization delay period deemed sufficiently long for all power (voltage VCC) to become stably restored. Accordingly, SAVE remains low (so that N5, N6 prevent un-restored DATA and DATA- from corrupting SA or SA-). However, RESTORE transitions high, turning on N1 and N2 and enabling SA, SA- to replenish DATA, DATA-.

MOSFETs P1–P4 and N1–N4 perform additional control functions during restoration as VCC is in the process of being restored. During the data restoration period, operation of the circuit is governed according to the state of slave latch (stored) data SA and SA-. For example, if SA is high, then:

RESTORE is high, turning on N1 and N2 and turning off P1 and P4 so that P1 and P4 do not affect the circuit I2 inverts SA, so that SA- is low Since SA- is low, N3 is off and N1/N3 do not affect the circuit Since SA is high, N4 is on Since RESTORE is high, N2 is on Since both N2 and N4 are on, SAR- is pulled low SAR- (being low) ensures the output of NAND2 is high Since NAND2's output is high, SW1 ensures DATA is high SAR- (being low) turns P2 on P2 (being on) pulls SAR high SAR (being high) turns P3 off so that P3 does not affect the circuit SAR (being high) allows DATA (the high output from NAND2 through SW1) to pass through NAND1 in main latch ML so that DATA- is low.

Significantly, DATA- is the output of the circuit, and is an inverted version of stored bit SA that has survived the power outage of VCC. In this manner, the data saved in slave latch SL is reinserted into main latch ML after VCC has been restored.

The foregoing operation (SA=high) may be summarized in the first data row in Table 1:

TABLE I

Data Restoration

| SA | SA- | N1 | N2 | N3 | N4 | SAR | SAR- | P1 | P2 | P3 | P4 |
|---|---|---|---|---|---|---|---|---|---|---|---|
| High | Low | On | On | Off | On | High | Low | Off | On | Off | Off |
| Low | High | | | On | Off | Low | High | | Off | On | |

Because of the symmetry of the connection of elements in the illustrated arrangement, operation of the circuit when SA is low (bottom row of Table I) is governed by the same principles described in detail above.

Back to Normal Mode. After the end of the data restore (stabilization delay) period, READY- returns low to announce that the circuit is ready (that is, the master latch's DATA- output can be trusted). SAVE goes high to enable SL to store data coming from ML. The circuit is back in normal mode, as described above.

In normal mode, Restore is low. A low Restore signal turns off both N1 and N2 and turns on both P1 and P4, precharging both SAR and SAR- nodes to a high (logic 1) voltage. Accordingly, during normal mode, logic 1 values of SAR and SAR- do not affect the outputs of NAND1 and NAND2, so that input data DATAIN is latched when SW1 is closed. This normal mode operation contrasts with that in the data restoration period, in which P1 and P4 are turned off but P2 and P3 transistors set only one of SAR and SAR-.

The described embodiments provide various advantages over conventional data retention arrangements.

For example, in the described embodiments there is no need to explicitly disable the main latch while awaiting stable power restoration or during power restoration. Likewise, no additional gate or signals are required, to disable the main data path until stable power restoration.

The illustrated embodiments provide a faster data restore time (from slave to main latch) because the main latch data outputs are derived from what are effectively "set" and "reset" inputs SAR, SAR- to main latch. Compared to conventional arrangements, less time is needed for the main latch to correctly resolve and allow the main data path to be enabled, inasmuch as data contention in the main latch is avoided. No special power sequence is required to start up the main latch ML when data is restored from slave latch SL to master latch ML. Specifically, there is no need to wait for power to the ML to be stable before restoring data from the SL to the ML, providing an increase in data restoration speed over conventional data retention latches.

The illustrated embodiment provides very low power consumption, especially when low leakage or long channel transistors are employed in the slave latch and related circuitry.

Only a single path for each of the DATA and DATA- signals is required to be sent from the main latch to the slave latch. Accordingly, virtually no unnecessary loading burdens data output path (DATA-), thereby minimizing delay through the latch. It is recognized that a minor delay is experience because NAND gates NAND1, NAND2 have one more input than the NAND gates (or inverters) of conventional main latches, but this delay may be considered insignificant.

The foregoing embodiments support an arrangement for retaining data output (DATA and/or DATA-) from a main circuit (ML) throughout a low power mode, and for restoring the retained data (SA, SA-) to the main circuit (ML) upon termination of the low power mode. The arrangement may include a slave latch (SL) configured to store the data output (DATA and/or DATA-) from the main circuit (ML) as the retained data (SA, SA-) throughout the low power mode, and a control portion (NOR1, 13, P1–P4, N1–N4) configured to restore the retained data (SA, SA-) to the main circuit (ML) through Set and Reset inputs (receiving SAR, SAR-) to the main circuit (ML), so as to unambiguously determine restored data output (DATA and/or DATA-) upon the termination of the low power mode.

The main circuit may be a main latch (ML) that receives at its Set and Reset inputs, Set and Reset signals (SAR, SAR-) that have values matching those of the retained data (SA, SA-); and the Set and Reset (SAR, SAR-) signals may directly control at least one main latch (ML) data output (DATA and/or DATA-) without delay other than a logic gate (NAND1 and/or NAND2) propagation delay.

The Set and Reset signals (SAR, SAR-) may be stably asserted before power (VCC) is stably restored to the main latch (ML).

The Set and Reset signals (SAR, SAR-) may be of opposite value, so as to prevent data contention in the main latch (ML) when the retained data (SA, SA-) is restored to the main latch (ML).

The Set and Reset signals (SAR, SAR-) have values that are the same as the retained data (SA, SA-).

The control portion may include first and second switches (N1, N2) whose respective control inputs (gates) are controlled by a Restore signal that is active only during an activation delay period following the low power mode; and third and fourth switches (N3, N4) whose respective control inputs (gates) are controlled by the retained data (SA, SA-). The first and third switches (N1, N3) are connected between a first constant voltage level (GND) and a first one (SAR) of the Set and Reset signals, and the second and fourth switches (N2, N4) are connected between the first constant voltage level (GND) and a second one (SAR-) of the Set and Reset signals.

The first, second, third and fourth switches (N1, N2, N3, N4) may be n-channel MOSFETs.

The arrangement may further include fifth and sixth switches (P1, P2) that are connected between a second constant voltage level (VCC) and the first one (SAR) of the Set and Reset signals, and whose respective control inputs (gates) are controlled by the Restore signal and the second one (SAR-) of the Set and Reset signals; and seventh and eighth switches (P3, P4) that are connected between the second constant voltage level (VCC) and the second one (SAR-) of the Set and Reset signals, and whose respective control inputs (gates) are controlled by the Restore signal and the first one (SAR) of the Set and Reset signals.

The fifth, sixth, seventh and eighth switches (P1, P2, P3, P4) may be p-channel MOSFETs.

The arrangement may further include (a) ninth and tenth switches (N5, N7) that are connected between a first input (SA) of the slave latch (SL) and a first constant voltage level (GND), and whose respective control inputs (gates) are controlled by (1) a Save signal that is active only during a normal mode that is distinct from the low power mode; and (2) a first (DATA) of the main circuit's data outputs; and (b) eleventh and twelfth switches (N6, N8) that are connected between a second input (SA-) of the slave latch (SL) and the first constant voltage (GND), and whose respective control inputs (gates) are controlled by the Save signal and a second (DATA-) of the main circuit's data outputs.

The ninth, tenth, eleventh and twelfth switches (N5–N8) may be n-channel MOSFETs.

The slave latch (SL) may require for its operation only a single input (N7 or N8) for each data output (DATA, DATA-) of the main circuit (ML), so as to minimize loading of the main circuit's data output(s) (DATA and/or DATA-).

The slave latch (SL) may include transistors that are all from a group including low leakage transistors and long channel transistors, so as to minimize power consumption.

The main circuit (ML) is a latch circuit including two cross-coupled logic gates (NAND1, NAND2) that receive respective ones of the Set and Reset signals.

In a normal mode distinct from the low power mode, the slave latch (SL) and main circuit (ML) may store input data (DATAIN) concurrently.

The arrangement may further include a Retain voltage source (VR) that continuously provides power to the slave latch (SL), even during the low power mode.

Also provided is a method for retaining data output from a main circuit throughout a low power mode and for restoring the retained data to the main circuit upon termination of the low power mode. The involves storing the data output from the main circuit in a slave latch as the retained data throughout the low power mode; and restoring the retained data to the main circuit through Set and Reset inputs to the main circuit, so as to unambiguously determine restored data output upon the termination of the low power mode.

The restoring step may include receiving, at Set and Reset inputs of the main circuit, Set and Reset signals that have values matching those of the retained data; and with the Set and Reset signals, directly controlling at least one main circuit data output without delay other than a logic gate propagation delay.

The method may further involve stably asserting the Set and Reset signals before stably restoring power to the main circuit.

The method may further involve, in a normal mode distinct from the low power mode, concurrently storing input data into the slave latch and into the main circuit.

Many alternatives, modifications, and variations will be apparent to those skilled in the art in light of the above teachings. For example, the choice of elements other than MOSFETs, or elements of different conductivity types, and the choice of different circuit components and configurations, lie within the scope of the present invention. Further, the design and adjustment of device size and properties, lie within the contemplation of the invention. It is therefore to be understood that within the scope of the appended claims and their equivalents, the invention may be practiced otherwise than as specifically described herein.

What is claimed is:

1. An arrangement for retaining data output from a main circuit throughout a low power mode and for restoring the retained data to the main circuit upon termination of the low power mode, the arrangement comprising:
   a slave latch configured to store the data output from the main circuit as the retained data throughout the low power mode; and
   a control portion configured to restore the retained data to the main circuit through Set and Reset inputs to the main circuit, so as to unambiguously determine restored data output upon the termination of the low power mode.

2. The arrangement of claim 1, wherein:
   the main circuit is a main latch that receives at its Set and Reset inputs, Set and Reset signals that have values matching those of the retained data; and
   the Set and Reset signals directly control at least one main latch data output without delay other than a logic gate propagation delay.

3. The arrangement of claim 2, wherein:
   the Set and Reset signals are stably asserted before power is stably restored to the main latch.

4. The arrangement of claim 2, wherein:
   the Set and Reset signals are of opposite value, so as to prevent data contention in the main latch when the retained data is restored to the main latch.

5. The arrangement of claim 4, wherein:
   the Set and Reset signals have values that are the same as the retained data.

6. The arrangement of claim 2, wherein the control portion includes:
   first and second switches whose respective control inputs are controlled by a Restore signal that is active only during an activation delay period following the low power mode; and
   third and fourth switches whose respective control inputs are controlled by the retained data;
   wherein the first and third switches are connected between a first constant voltage level and a first one of the Set and Reset signals; and
   wherein the second and fourth switches are connected between the first constant voltage level and a second one of the Set and Reset signals.

7. The arrangement of claim 6, wherein:
   the first, second, third and fourth switches are n-channel MOSFETs.

8. The arrangement of claim 6, further comprising:
   fifth and sixth switches that are connected between a second constant voltage level and the first one of the Set and Reset signals, and whose respective control inputs are controlled by the Restore signal and the second one of the Set and Reset signals; and
   seventh and eighth switches that are connected between the second constant voltage level and the second one of the Set and Reset signals, and whose respective control inputs are controlled by the Restore signal and the first one of the Set and Reset signals.

9. The arrangement of claim 8, wherein:
   the fifth, sixth, seventh and eighth switches are p-channel MOSFETs.

10. The arrangement of claim 2, further comprising:
    a) ninth and tenth switches that are connected between a first input of the slave latch and a first constant voltage level, and whose respective control inputs are controlled by:
       1) a Save signal that is active only during a normal mode that is distinct from the low power mode; and
       2) a first of the main circuit's data outputs; and
    b) eleventh and twelfth switches that are connected between a second input of the slave latch and the first constant voltage, and whose respective control inputs are controlled by the Save signal and a second of the main circuit's data outputs.

11. The arrangement of claim 10, wherein:
    the ninth, tenth, eleventh and twelfth switches are n-channel MOSFETs.

12. The arrangement of claim 2, wherein:
    the slave latch requires for its operation only a single input for each data output of the main circuit, so as to minimize loading of the main circuit's data output(s).

13. The arrangement of claim 2, wherein:
the slave latch includes transistors that are all from a group including low leakage transistors and long channel transistors, so as to minimize power consumption.

14. The arrangement of claim 2, wherein:
the main circuit is a latch circuit including two cross-coupled logic gates that receive respective ones of the Set and Reset signals.

15. The arrangement of claim 2, wherein:
in a normal mode distinct from the low power mode, the slave latch and main circuit store input data concurrently.

16. The arrangement of claim 1, wherein:
the slave latch requires for its operation only a single input for each data output of the main circuit, so as to minimize loading of the main circuit's data output(s).

17. The arrangement of claim 1, wherein:
the slave latch includes transistors that are all from a group including low leakage transistors and long channel transistors, so as to minimize power consumption.

18. The arrangement of claim 1, wherein:
the main circuit is a latch circuit including two cross-coupled logic gates that each receive one of Set and Reset signals that completely control the data output upon the termination of the low power mode.

19. The arrangement of claim 1, wherein:
in a normal mode distinct from the low power mode, the slave latch and main circuit store input data concurrently.

20. The arrangement of claim 1, further comprising:
a Retain voltage source that continuously provides power to the slave latch, even during the low power mode.

21. A method for retaining data output from a main circuit throughout a low power mode and for restoring the retained data to the main circuit upon termination of the low power mode, the method comprising:
storing the data output from the main circuit into a slave latch as the retained data throughout the low power mode; and
restoring the retained data to the main circuit through Set and Reset inputs to the main circuit, so as to unambiguously determine restored data output upon the termination of the low power mode.

22. The method of claim 21, wherein the restoring step includes:
receiving, at Set and Reset inputs of the main circuit, Set and Reset signals that have values matching those of the retained data; and
with the Set and Reset signals, directly controlling at least one main circuit data output without delay other than a logic gate propagation delay.

23. The method of claim 22, further comprising:
stably asserting the Set and Reset signals before stably restoring power to the main circuit.

24. The method of claim 22, further comprising:
in a normal mode distinct from the low power mode, concurrently storing input data into the slave latch and into the main circuit.

* * * * *